(12) United States Patent
Fernandez et al.

(10) Patent No.: US 6,376,984 B1
(45) Date of Patent: Apr. 23, 2002

(54) PATTERNED HEAT CONDUCTING PHOTOCATHODE FOR ELECTRON BEAM SOURCE

(75) Inventors: Andres Fernandez, Dublin; Marian Mankos, San Francisco; Tai-Hon Philip Chang, Foster City; Kim Lee, Fremont; Steven T. Coyle, Newark, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/364,274

(22) Filed: Jul. 29, 1999

(51) Int. Cl.[7] .................................................. H01J 31/50
(52) U.S. Cl. ................................... 313/530; 313/231.01
(58) Field of Search ........................... 313/231.01, 530, 313/539, 542, 544; 315/111.81

(56) References Cited

U.S. PATENT DOCUMENTS

| | | | |
|---|---|---|---|
| 3,757,151 A | 9/1973 | Ace | 313/39 |
| 4,060,823 A | * 11/1977 | Howorth et al. | 357/30 |
| 5,684,360 A | 11/1997 | Baum et al. | 313/542 |

FOREIGN PATENT DOCUMENTS

| | | | | |
|---|---|---|---|---|
| GB | 1441744 | * 10/1973 | | 313/231.01 |
| GB | 2164787 | 3/1986 | | |

OTHER PUBLICATIONS

PCT International Search Reprt dated May 7, 2001.; European Patent Office, P.B. 5818 Patentaan 2 NL02280 HV Rijswijk.

* cited by examiner

Primary Examiner—Nimeshkumar D. Patel
Assistant Examiner—Todd Reed Hopper
(74) Attorney, Agent, or Firm—Janah and Associates

(57) ABSTRACT

A photocathode emitter as a source of electron beams, having an optically transmissive substrate patterned to define a protrusion, heat conducting material occupying the space surrounding the protrusion, and a photoemitter layer over the protrusion. The photoemitter is positioned on the side of the substrate opposite the surface on which the illumination is incident, and has an irradiation region at the contact with the top of the protrusion patterned on the substrate, and an emission region opposite the irradiation region, these regions being defined by the path of the illumination. The heat conducting material around the protrusion conducts heat away from this focused region of illumination on the photocathode to allow higher currents to be achieved from the photocathode and thus permits higher throughput rates in applications including electron beam lithography. In one version, the photocathode is fabricated using microfabrication techniques, to achieve a small emission spot size.

20 Claims, 4 Drawing Sheets

PATTERNED HEAT CONDUCTING PHOTOCATHODE FOR ELECTRON BEAM SOURCE

FIELD OF THE INVENTION

This invention relates to electron beam sources and, more particularly, to photocathodes for the generation of electron beams.

BACKGROUND

Electron beam (e-beam) sources are used in several fields, including scanning electron microscopes, defect detection instruments, VLSI testing equipment and electron beam (e-beam) lithography. In general, e-beam systems include an electron beam source and electron optics. The electrons are accelerated from the source and focused to define an image at a target. These systems typically use a physically small electron source having a high brightness.

Improvements in optical lithography techniques in recent years have enabled a considerable decrease in the line widths of circuit elements in integrated circuits. Optical methods will soon reach their resolution limits. Production of integrated circuit elements with smaller line widths (i.e., those with line widths less than about 0.1 $\mu$m) will require new techniques such as X-ray or e-beam lithography, which can provide accompanying resolutions well below 1 $\mu$m because of the shorter wavelengths associated with X-rays or electrons.

In e-beam lithography, (also called charged particle beam lithography), a beam of e.g. electrons from an electron source is directed onto a substrate. The electrons expose a resist layer (in this case an electron sensitive resist) on the substrate surface. Electron beam lithography uses what are called "electron lenses" to focus the electron beam. These are not optical (light) lenses but are either electro-static or magnetic. Typically, electron beam lithography is used for making masks; however it can also be used for direct exposure of semiconductor wafers.

Since modern lithographic systems must achieve fast writing times (high throughput rates) in addition to high resolution, their electron beams must also have a high brightness, which in the case of electron beams requires a high current density. This property is especially important for so-called direct write applications in which the electron beam is rapidly scanned and modulated so as to effect a projection of the image of a highly complex circuit directly onto a semiconducting chip substrate.

The primary motivation for using multiple beams in an electron-beam lithography system is to increase the total current that can be delivered while minimizing space-charge effects in each beam. FIG. 1 depicts in a side view one type of so-called "hybrid" multiple e-beam lithography, in which multiple electron beams are created by focusing an array of light beams, where each light beam's intensity can be independently regulated, onto a photocathode in transmission mode (wherein the photocathode is back-illuminated with the light beams which are focused on a photoemission layer). The electron beams emitted from the photoemission layer are then accelerated, focused, and scanned across the wafer or mask using a conventional electron-optical column.

A conventional mask 118 (reticle) of the type now used in photolithography is positioned on a conventional stage 124 which may or may not be movable along one or both of the depicted x and y axes, depending on the type of photolithography subsystem. A source of the light is, for instance, a conventional UV light source or a laser illumination system 114 of the type now used in photolithography, which provides a relatively large diameter beam 116 of, for instance, laser illumination light which passes through the transparent portions of the mask 118. It is to be understood that the mask is a substrate transparent to the incident light 116 on which are located opaque areas. The transparent portions of the substrate define the image which is to be transferred by the mask 118. Typically, one such mask includes the entire pattern of one layer of a single integrated circuit die. The mask is usually, in terms of its X, Y dimensions, some convenient multiple of the size of the actual die being imaged.

A light optical lens system 128 (which is actually a lens system including a large number of individual lens components) focuses the light 126 passed by the mask 118. The light optical lens system 128 is either a 1:1 or demagnifying lens system which demagnifies by e.g. a factor of four or five the image 126 incident thereon to form image 130, which in turn is incident onto the object. A 1:1 ratio is more advantageous when mask size is limited. In this case the object, rather than being a semiconductor substrate, is the photosensitive backside of a photoemission cathode 132. The photoemission cathode 132 defines for instance a minimum feature size of 0.5 micrometers or less, the minimum feature size of course being dependent upon the parameters of the system. The photoemission cathode 132 is for example a thin gold (or other metal) layer deposited on a transparent substrate.

The photoemission cathode 132 (which like the other elements herein is shown in simplified fashion) includes a photoemission cathode layer 134 which absorbs the incident photons 126 and causes electrons present in the photoemission layer 134 to be excited above the vacuum level. Some portion of the electrons 138 which retain sufficient energy to escape from the photoemission layer 134 are emitted into the vacuum portion 140 of the photoemission cathode downstream from the photoemission layer 134. An electric voltage (typically several kilovolts to tens of kilovolts) is applied to the extraction electrode 142 associated with the photoemission cathode 132. Extraction electrode 142 extracts the electrons 138 which have escaped from the photoemission layer 134 and accelerates them. Thus the accelerated electrons 146 form a virtual image of the incident photons 130. In effect then the photoemission cathode 132 and extraction electrode 142 form a divergent lens.

There may also be, immediately downstream of the extraction electrode 142, a magnetic (or electrostatic) lens (not shown) to reduce aberrations. (A magnetic lens is conventionally a set of coils and magnetic pole pieces, and yokes which focus the electron beam.) Such an electron beam system has been found to offer resolution of below 10 nm. Immediately following (downstream of) this portion of the system is a conventional electron optical lens system 150 consisting of one or more electron lenses and alignment, deflection and blanking systems 152 (shown only schematically in FIG. 1).

This lens system further demagnifies the virtual image 146 at the writing plane, which is the plane of the principal surface of the wafer 158 by a factor determined to achieve the desired minimum feature size. For instance, if a minimum feature size of 0.5 $\mu$m is resolved at the photoemission cathode, an electron beam demagnification factor of five times is needed for a 100 nanometer minimum feature size on the wafer 158. This means that when a total area of approximately 1 mm×1 mm is exposed on the wafer 158, a total illuminated area of 5 mm×5 mm is required on the photoemission cathode layer 134. Correspondingly for a 4:1 demagnification ratio an area of 20 mm×20 mm is illuminated on the mask 18, and a 5 mm×5 mm area is illuminated for a 1:1 ratio. Of course these are merely illustrative parameters.

The total demagnification factor and exposed wafer area can be varied to achieve the desired minimal feature size and throughput. The wafer 158, including its electron beam resist layer 160, is typically supported on a stage 164 which is movable in the x, y and z axes, as is conventional. Other elements of both the photo and the electron beam subsystems which are well known are not shown, but include positioning measurement systems using for instance laser interferometer to determine the exact location of the mask on its stage and the wafer on its stage, vacuum systems, air bearing supports for the stages, various vibration absorption and isolation mechanisms to reduce environmental effects, and suitable control systems, all of the type well known in the lithography field.

The deflection system 152 can be used to compensate for positionary errors due to mask/wafer misalignment, vibrations, heating and other effects, and would only use very small deflection amplitudes.

FIG. 2 shows in a side cross-sectional view a portion of a photocathode 200 having an optically transmissive substrate 201 and a photoemission layer 202. The photocathode array 200 is back-illuminated by light (laser) beams 203 (having an envelope defined as shown) focused on photoemision layer 202 at irradiation region 205. As a result of the back-illumination onto photoemission layer 202, electron beams 204 are generated at an emission region 208 opposite each irradiation region 205. Other systems are known where the photoemitter is front-illuminated, i.e., the light beams are incident on the surface of the photoemitter from which the electron beam is emitted.

Photoemission layer 202 is made from any material that emits electrons when irradiated with light. These materials include metallic films (gold, aluminum, etc.) and, in the case of negative affinity (NEA) photocathodes, semiconductor materials (especially compounds of Group III and Group V elements such as gallium arsenide). Photoemission layers in negative electron affinity photocathodes are discussed in Baum (U.S. Pat. No. 5,684,360).

When irradiated with photons having energy greater than the work function of the material, photoemission layer 202 emits electrons. The resulting electron beam is shown below region 208 and has a lateral extent shown by the lines crossing at region 208. Typically, photoemission layer 202 is grounded so that electrons are replenished. Photoemission layer 202 may also be shaped at emission region 208 in order to provide better irradiation control of the beam of electrons emitted from emission region 208.

Photons in light beam 203 have an energy of at least the work function of photoemission layer 202. The number of emitted electrons is directly proportional to the intensity of the light beam. Photoemission layer 202 is thin enough and the energy of the photons in light beam 203 is great enough that a significant number of electrons generated at irradiation region 203 migrate and are ultimately emitted from emission layer 208.

Transparent substrate 201 is transparent to the light beam and supports the photocathode device within an electron beam column which may be a conventional column or a microcolumn. Transparent substrate 201 may also be shaped at its surface where light beams 203 are incident in order to provide focusing lenses for light beams 203. Typically, transparent substrate 201 is a glass although other substrate materials such as sapphire or fused silica are also used.

One of the critical challenges in developing a photocathode as the electron beam source in multiple electron beam lithography featuring high current is the ability to conduct heat away from the focused regions of illumination on the photocathode. The laser power needed to produce a certain beam current depends on the conversion efficiency of the photocathode material. A considerable amount of energy per unit area is dissipated in these regions due to the relatively low conversion efficiency of the photoemission process. For example, if a gold film approximately 15 nm in thickness is used as the photoemission layer 202, the efficiency is about $5 \times 10^{-5}$, which implies that 5 mW of laser beam power is needed to produce a 100 nA electron beam.

When this amount of power is focused into a small spot (approximately 1 $\mu$m diameter) on a thin film, the heat flow is limited by conduction through the cathode support material. This conduction path is inefficient due to the generally low thermal conductivity of common optically transparent substrate materials such as fused silica (glass). Consequently, a significant temperature rise will occur at the photocathode. For a fused silica substrate and a 1 $\mu$m spot size, a 15 nm gold film (used as the photoemitter) will be heated on the order of 1000° C. Without adequate cooling, the resulting temperature rise could degrade or even destroy the photocathode. This may impose a severe limit on the total current that can be generated in each beam and thus may limit the overall throughput of the lithography system. Clearly, there is a need for adequate cooling for the photocathode.

While others have contemplated the use of thermoelectric devices for cooling photocathodes (wherein the thermoelectric device is directly secured to the photocathode, or a layer of electrically insulating but thermally conductive material is interposed between the thermoelectric device and the photocathode-see Ace, U.S. Pat. No. 3,757,151), the physical size of these devices prevent their use in e-beam lithography.

SUMMARY

According to the present invention, a photocathode device is operable to emit multiple high current density beams of electrons upon illumination with appropriate light, and there is an associated electron beam generator which includes the photoemissive cathode and is suitable for a semiconductor lithography system. The photocathode device includes an optically transmissive substrate material which is patterned to have protrusions. Spaces between the protrusions are at least partly filled with material that has a high thermal conductivity (copper, gold, or platinum, for example). The photoemitter is deposited over the protrusions.

The photoemitter is positioned on the surface of the substrate opposite the surface receiving illumination, and thereby has an irradiation region at the contact area with the optically transmissive substrate, and an emission region opposite the irradiation region, these regions being defined by the axis of the light beams. Heat is generated by the light beams incident at this interface. The diameter of the tip of the protrusion in one embodiment defines the areal extent of the emission region.

An advantage of this structure is that spaces between the protrusions are occupied by material having a high thermal conductivity (copper, gold, or platinum for example). If the thickness of the heat conducting material is large in relation to the diameter of the protrusion on the substrate, then heat conduction away from the irradiation region/emission region interface is dominated by the lateral flow of heat in the conducting material. The thermal conductivities of copper, gold, and platinum are at least 200 times greater than that of fused silica, which is an alternative substrate material for photocathodes. Accordingly, a proportionally lower temperature rise at the irradiation region of the photoemissive layer is expected for a given incident power and laser spot size. This efficiently conducts heat away from the irradiation region/emission region interface, and therefore allows higher operating currents to be achieved from the photocathode. This, in turn, permits higher throughputs in applications including electron beam lithography.

The present structure advantageously can be fabricated using standard microfabrication techniques. For example, the substrate protrusions can be patterned by conventional microlithography followed by reactive ion etching. Heat conducting material can be deposited by, for example, sputtering or thermal evaporation. Chemical mechanical polishing can be used to remove heat conducting material from the tip of the protrusions. Alternatively, the heat conducting material could be deposited by electroplating. The final step is depositing the photoemitter. By using conventional microfabrication techniques, the emission spot size (which coincides with the tip of the protrusions on the substrate) can be reduced to less than 1 μm diameter. With this small emission spot size, a lower column demagnification is needed to achieve a given beam size at the target wafer. Lower column demagnification can be achieved in a shorter column, which advantageously decreases total blur due to electron-electron interactions. Accordingly, a higher throughput can be realized as a greater number of emission points is used, or a larger area on a target wafer can be written at one time.

The invention and its various embodiments are further discussed along with the following figures and accompanying text.

DETAILED DESCRIPTION

Figure 1:
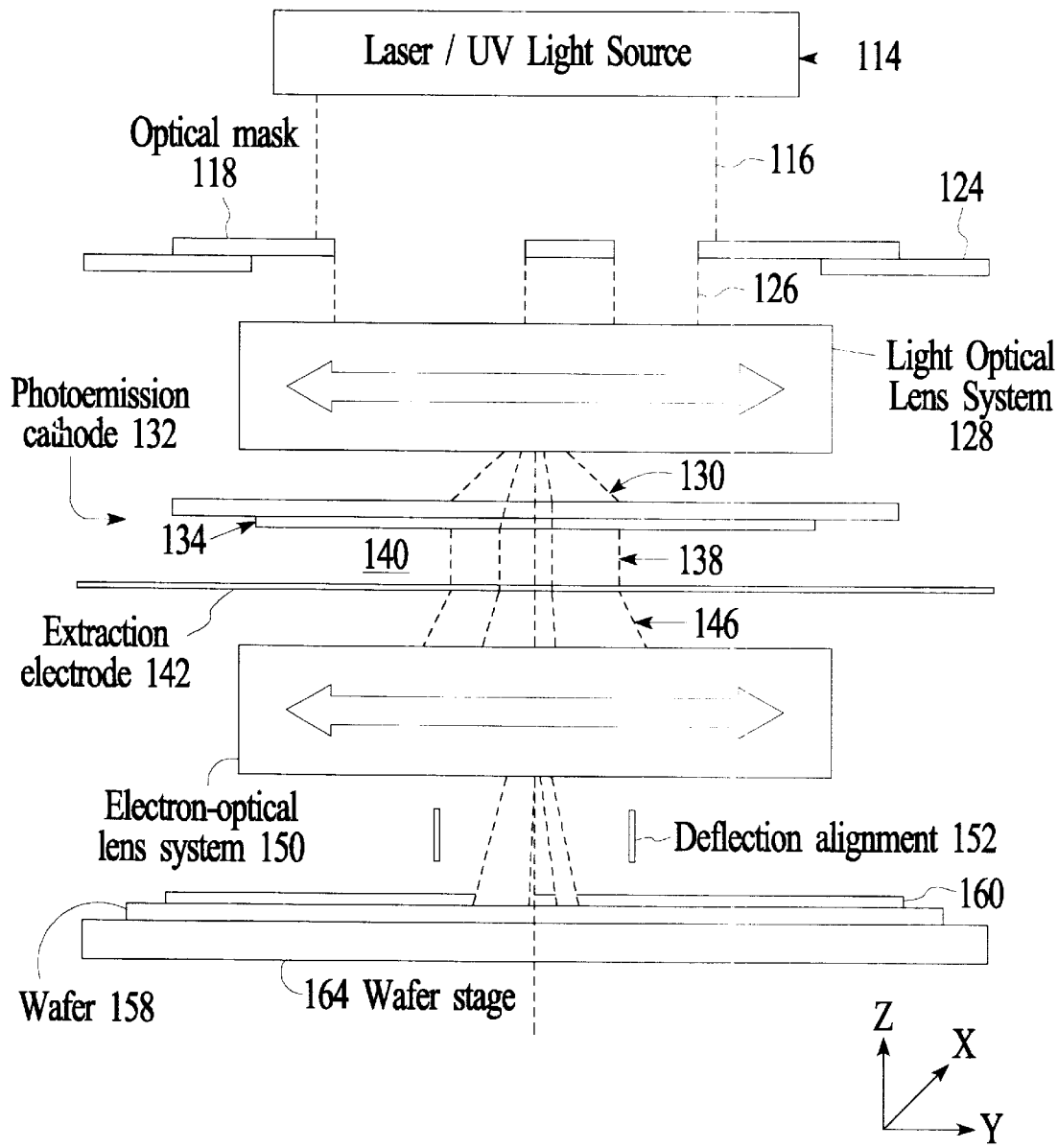
FIG. 1 shows an electron beam lithography system according to the prior art.
Figure 2:
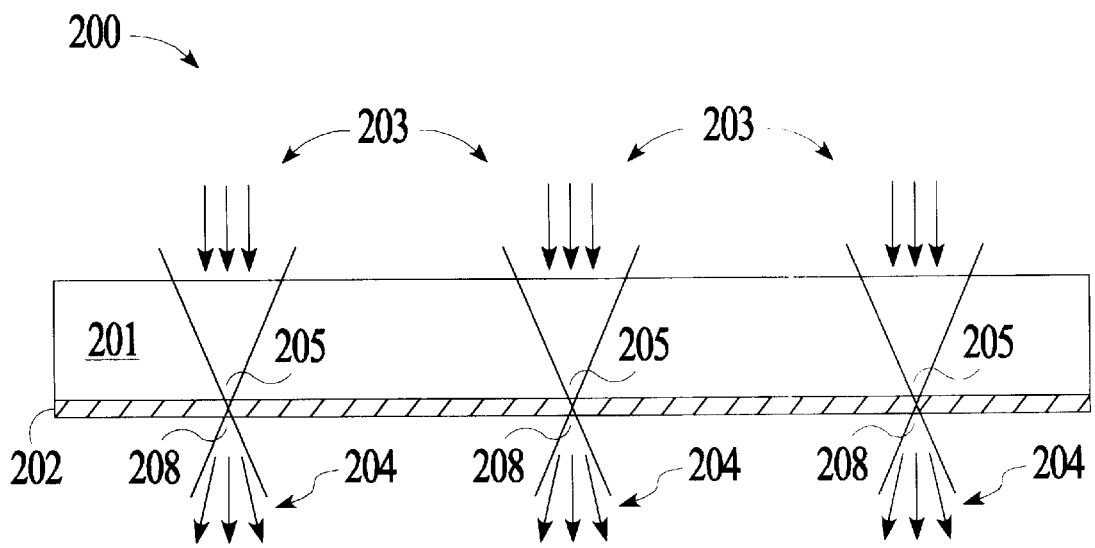
FIG. 2 shows a photocathode with multiple emission regions according to the prior art.
Figure 3:
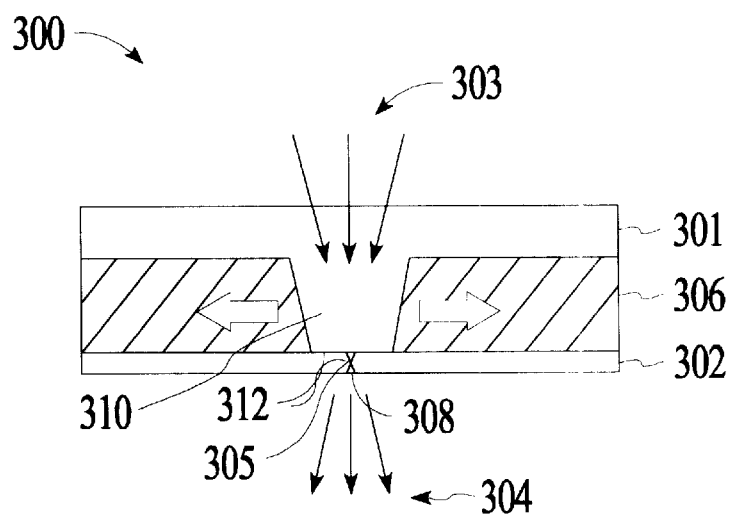
FIG. 3 shows a side view of a photocathode according to an embodiment of the present invention.

FIG. 3 shows in a side cross-sectional view an embodiment of a single emitter of a photocathode 300 according to the present invention (the conventional associated supports, vacuum housing, electrical leads, etc. are not shown). It is to be understood that a single photocathode could have a large number of such emitters. The substrate 301 supporting the photoemitter 302 has been patterned to define a protrusion 310 having a tip 312. Space surrounding the protrusion is occupied by heat conducting material 306. A photoemitter 302 overlies the protrusion 310. The protrusion is e.g., circular in plan view (see FIG. 4). Light beams 303 are incident on the upper surface of transparent substrate 301, and are absorbed by photoemitter 302 at irradiation region 305. A laser and associated beam splitting, focusing, and modulating optics conventionally is the source of the light beams. For example, a frequency doubled Ar laser and a lasing wavelength of 257 nm can be used, but other configurations are possible. Photoemitter 302 emits electrons 304 from emission area 308, which is the surface of photoemitter 302 opposite irradiation region 305, when light beams 303 are incident upon irradiation region 305. The irradiation region 305 and the emission region 308 meet at an interface; heat is generated by the light beams incident at this interface. The diameter of the circular tip 312 of the protrusion of substrate 310 defines the areal extent of the emission region.

Substrate 301 is optically transmissive to light beam 303 so that the maximum amount of light possible is incident on irradiation region 305. The thickness of the substrate 301 ranges from, e.g., 0.2 μm to 1 millimeter, or even thicker. The tip 312 of the protrusion of substrate 310 in one embodiment has a typical diameter of 1 μm and is circular. Suitable substrate materials are glass, fused silica, or sapphire, but not so limited.

The heat conducting material 306 occupies the space between the conical protrusions patterned on the substrate 301. The heat conducting material 306 is preferably composed of copper, gold, or platinum, or other material (metal or otherwise) having a high thermal conductivity, such as diamond (see related U.S. Pat. 6,011,269, "Diamond Supported Photocathode for Electron Sources", Inventors Andres Fernandez, Tim Thomas, Xiaolan Chen, Steven T. Coyle, Ming Yu, Marian M. Mankos, herein incorporated by reference). The thickness of the heat conducting material 306 can range from 1 μm to 10 μm or even thicker, but is preferably at least ten times the diameter of the tip 312 of the protrusions of substrate 301. With this ratio of dimensions, heat conduction away from the irradiation region/emission region interface is dominated by the lateral flow of heat in the conducting material 306. This, in turn, leads to significantly less temperature rise at the irradiation region/emission region interface. For example, gold has a thermal conductivity more than 200 times that of fused silica, which is an alternative substrate material for e-beam lithography photocathodes. Since the amount of heat conducted away from the irradiation region is proportional to the thermal conductivity of the substrate material, a proportionally lower temperature rise at the photocathode is expected for a given incident power and laser spot size. The protrusions patterned on the substrate need not be conical or circular in cross-section.

Photoemitter 302 is of any material that emits electrons when illuminated. Examples of photoemitting materials include gold, and carbide materials. In addition, many compounds of Group III and Group V elements, such as GaAs, are suitable photoemitter materials.

Photoemitter 302 has a work function determined by the photoemitter 302 material. The work function is the minimum energy required to release an electron from the material. The photons in light beams 303 must have an energy at least as great as the work function so that photoemitter 302 emits electrons.

Light beams 303 are absorbed by photoemitter 302 throughout the irradiation region 305 from the substrate to the vacuum surface. At that point, the emitted electrons have a kinetic energy equal to the photon energy minus the work function. These electrons migrate from irradiation region 305 to emission region 308 and are emitted at emission region 308, provided that the electrons have not lost too much energy to collisions within the photoemitter 302 material. As such, the thickness of photoemitter 302 should be sufficient to absorb light beams 303 but not so thick as to reabsorb a significant number of the free electrons created. Preferably, photoemitter 302 is of gold and has a thickness of about 15 nanometers. However, the photoemitter may range in thickness from 1 nm to 1 mm, for example. The invention is not limited to any particular photoemitting materials or dimensions.

Figure 4:
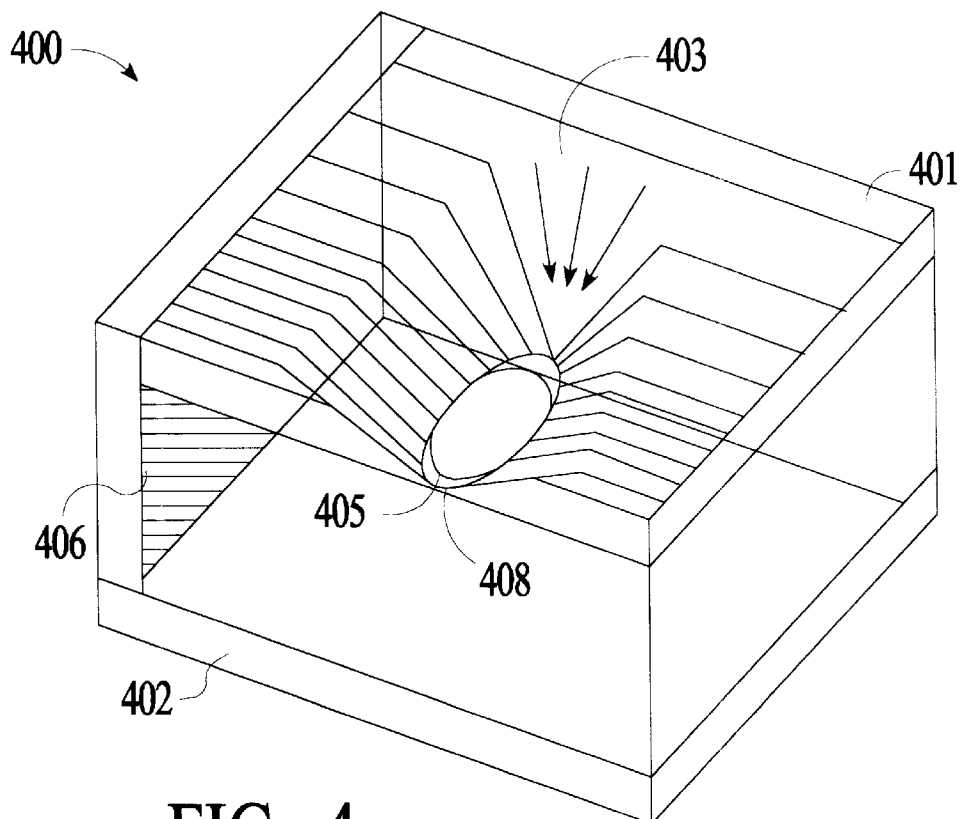
FIG. 4 shows, in plan view, a photocathode according to FIG. 3.

FIG. 4 depicts in a plan view the photocathode of the type shown in FIG. 3. The heat conducting material 406 accommodates a conical protrusion in the substrate 401. The protrusion terminates in a tip which is circular. Photoemitter 402 is just below this tip. Light (laser) beams 403 are incident upon irradiation region 405, resulting in the emission of electrons from emission region 408, which is circular. Preferably, the emission region has a diameter ranging from 0.1 µm to 5 µm. Of course, other shapes are possible for the emission region.

Figure 5:
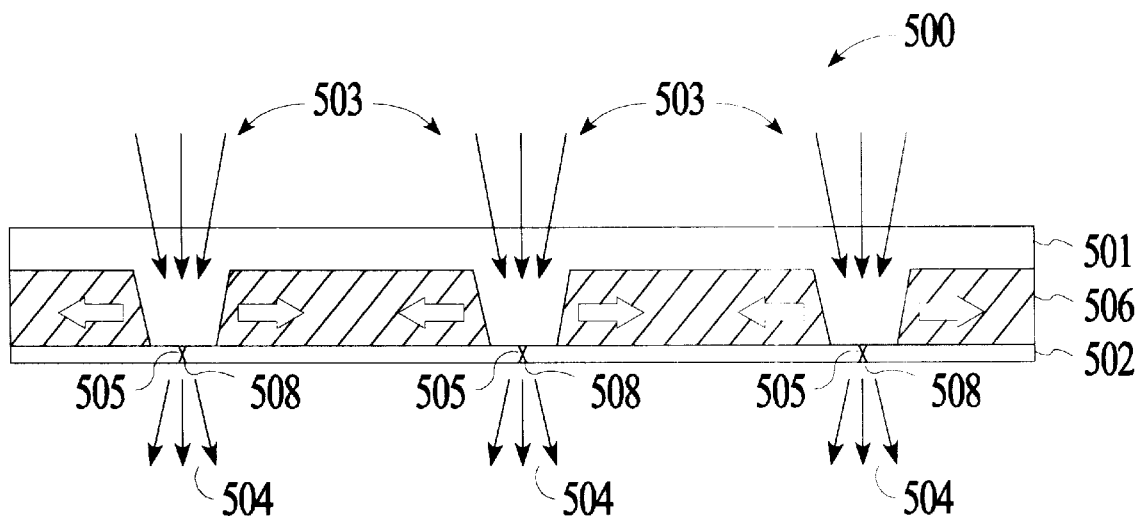
FIG. 5 shows a photocathode according to FIG. 3 having a multiple emission regions.

FIG. 5 depicts in a side cross-sectional view of a photocathode 500 of the type shown in FIG. 3 having multiple emission regions 508. The photocathode 500 comprises a substrate 501, heat conducting material 506, and photoemitter 502. When the multiple irradation regions 505 are illuminated with illumination beams 503, each emission region 508 generates electron beam 504.

Figure 6A:
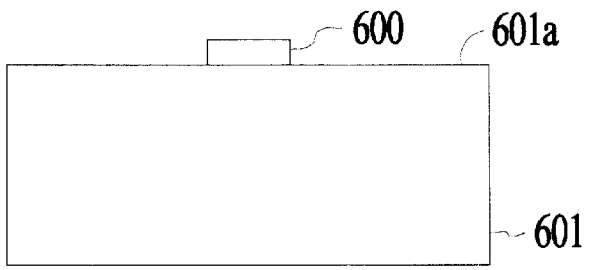
FIGS. 6A–6E show the steps in fabricating a photocathode according to FIG. 3.
Figure 6B:
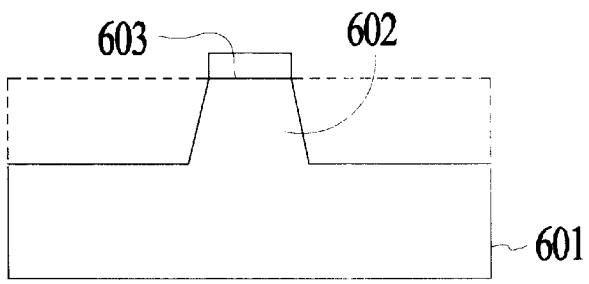

FIGS. 6A–6E depict steps for producing a photocathode as in FIG. 3. In FIG. 6A, optically transmissive substrate 601 is subject to well-known photolithography and etching techniques to pattern a protrusion on its surface. A dark-field mask could be used with a negative photoresist, or a clear field mask and a positive photoresist could be used to pattern the protrusion. A layer of photoresist 600 is applied to a portion of a selected surface 601a of the substrate. The principal surface 601a of the substrate 601 is then exposed to ultraviolet light through a mask. FIG. 6B shows the subsequent etching step after development of the exposed photoresist, wherein etchants remove the portion of the substrate's top surface that is not covered with developed photoresist. This results in a protrusion 602 on the selected surface 601a of the substrate 601, the protrusion 602 having a tip 603. This etching step is, for example, reactive ion etching.

Figure 6C:
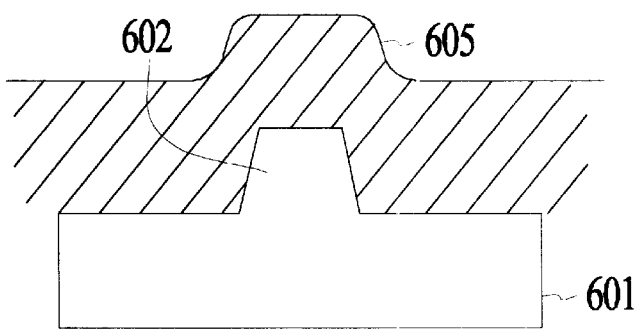

FIG. 6C shows the next step, wherein heat conducting material 605 is deposited conformably on the principal surface of the substrate 601. The heat conducting material is deposited, for example, by sputtering or thermal evaporation. Alternately, the heat conducting material may be deposited by electroplating, in which case the step shown in FIG. 6D is not needed.

Figure 6D:
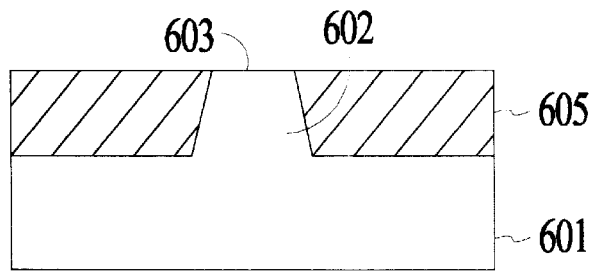

FIG. 6D shows the next step, where the heat conducting material 605 and the substrate 601 are planarized so that the tip 603 of the protrusion 602 is planar with the heat conducting material 605. This planarizing step is, for example, chemical mechanical polishing.

Figure 6E:
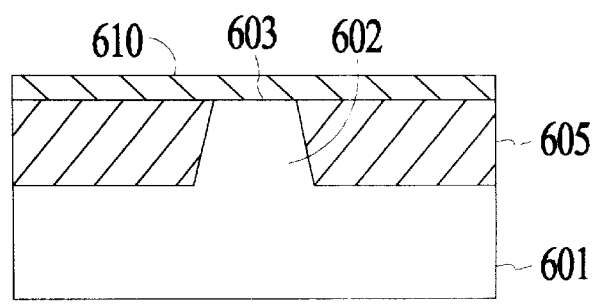

FIG. 6E shows the final step, wherein photoemitter 610 is formed by, for example, thermal evaporation or sputtering, over the tip 603 of the protrusion 602 on the substrate 601 and over the heat conducting layer 605.

This disclosure is illustrative and not limiting; further modifications will be apparent to one skilled in the art and are intended to fall within the scope of the appended claims.

We claim:

1. A photocathode device comprising:
   a substrate optically transmissive to illumination, said substrate having a back surface to receive incident illumination and an opposing front surface;
   a heat conducting material on said front surface, said heat conducting material accommodating a protrusion of said substrate, said protrusion terminating in a tip; and
   a photoemitter over said tip, said photoemitter having an irradiation region at said substrate and an emission region opposite said irradiation region, whereby said photoemitter emits a beam of electrons upon exposure to said illumination.

2. The photocathode device of claim 1, wherein a thickness of said photoemitter ranges from 1 nm to 1 µm.

3. The photocathode device of claim 1, wherein a thickness of said substrate ranges from 1 µm to 1 mm.

4. The photocathode device of claim 1, wherein said photoemitter is of gold.

5. The photocathode device of claim 2, wherein said photoemitter has a thickness of about 15 nm.

6. The photocathode device of claim 1, wherein a thickness of said heat conducting material ranges from 1 µm to 10 µm.

7. The photocathode device of claim 1, wherein said heat conducting material is of copper, gold, platinum, or diamond.

8. The photocathode device of claim 1, wherein said emission region is circular in cross-section.

9. The photocathode device of claim 1, wherein said emission region has a diameter of 0.1 µm to 5 µm.

10. The photocathode device of claim 1, wherein the ratio of the thickness of said heat conducting material to the diameter of said tip of said protrusion is at least 10 to 1.

11. The photocathode device of claim 1, wherein said photoemitter emits electron upon exposure to incident illumination by a laser beam.

12. The photocathode device of claim 1, further comprising a plurality of said irradiation regions and said emission regions, which are planarly collocated.

13. A method of fabricating a photocathode, comprising the acts of:
   providing an optically transmissive substrate;
   etching a principal surface of said substrate to define a protrusion on said substrate, said protrusion pattern terminating in a tip;
   forming heat conducting material on said principal surface of said substrate so that said tip is planar with said heat conducting material; and
   forming a photoemitter material over said tip of said protrusion.

14. The method of claim 13, wherein said photoemitter is also formed over said heat conducting material.

15. The method of claim 13, wherein said etching is reactive ion etching.

16. The method of claim 13, wherein said forming is completed by sputtering and planarizing.

17. The method of claim 13, wherein said forming is completed by thermal evaporation and planarizing.

18. The method of claim 13, wherein said forming is completed by electroplating.

19. The method of claim 17, wherein said planarizing is chemical mechanical polishing.

20. An electron beam generator comprising:
   a source of illumination;
   a support for holding a partially opaque mask to be illuminated by said source of illumination;
   an optical lens located to focus the illumination that passes through said mask;
   a photocathode device located to receive the focused illumination and convert the illumination into an electron stream, said photocathode device comprising:
   a substrate optically transmissive to illumination, said substrate having a back surface to receive incident illumination and
   an opposing front surface;
   a heat conducting material on said front surface, said heat conducting material accommodating a protrusion of said substrate, said protrusion terminating in a tip; and
   a photoemitter over said tip, said photoemitter having an irradiation region at said substrate and an emission region opposite said irradiation region, whereby said photoemitter emits beam of electrons upon exposure to said illumination;

an electron lens located to focus the electron stream into a beam; and a support for a substrate, the support for the substrate being located so that the electron beam is incident on a surface of the substrate.

* * * * *